United States Patent
Li et al.

(10) Patent No.: US 10,742,185 B1
(45) Date of Patent: Aug. 11, 2020

(54) SYSTEM AND METHOD OF OPERATING AUTOMATIC GAIN CONTROL IN THE PRESENCE OF HIGH PEAK-TO-AVERAGE RATIO BLOCKERS

(71) Applicant: Silicon Laboratories Inc., Austin, TX (US)

(72) Inventors: Wentao Li, Austin, TX (US); Guner Arslan, Austin, TX (US); Yan Zhou, Spicewood, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/367,908

(22) Filed: Mar. 28, 2019

(51) Int. Cl.
| | |
|---|---|
| *H03G 3/30* | (2006.01) |
| *H04L 27/26* | (2006.01) |
| *H04B 1/18* | (2006.01) |
| *H03F 3/189* | (2006.01) |
| *H03M 1/12* | (2006.01) |
| *H03F 1/26* | (2006.01) |

(52) U.S. Cl.
CPC ............ *H03G 3/3068* (2013.01); *H03F 1/26* (2013.01); *H03F 3/189* (2013.01); *H03G 3/3078* (2013.01); *H03M 1/12* (2013.01); *H04B 1/18* (2013.01); *H04L 27/2647* (2013.01)

(58) Field of Classification Search
CPC ............... H03G 3/3068; H03G 3/3078; H04L 27/2647; H03M 1/12; H03F 3/189; H03F 1/26; H04B 1/18
See application file for complete search history.

(56) References Cited

U.S. PATENT DOCUMENTS

| | | | |
|---|---|---|---|
| 8,938,207 B2* | 1/2015 | Miyano | H03F 1/3247 455/232.1 |
| 9,264,280 B1* | 2/2016 | Waheed | H04L 27/3809 |
| 9,344,202 B2* | 5/2016 | Eddowes | H03G 3/3068 |
| 2008/0003967 A1* | 1/2008 | Kuroda | H03G 3/3068 455/232.1 |
| 2017/0288916 A1* | 10/2017 | Mendel | H04L 25/03847 |

* cited by examiner

*Primary Examiner* — Jean B Corrielus
(74) *Attorney, Agent, or Firm* — Gary Stanford; Huffman Law Group, PC

(57) ABSTRACT

A wireless receiver including a gain network that adjusts a gain of a received wireless signal and provides an RF signal, a level detector that provides a level indication while a strength of the RF signal is at least an RF level threshold, a timing system that provides a timing value indicative of a total amount of time that the level indication is provided during a timing window, a gain up disable circuit that provides a gain up disable signal when the timing value reaches a low threshold, a blocker strength detect circuit that provides a gain down request signal when the timing value reaches a high threshold, and an AGC circuit that does not increase the gain of the gain network while the gain up disable signal is provided, and that allows a reduction of the gain of the gain network while the gain down request signal is provided.

20 Claims, 5 Drawing Sheets

SYSTEM AND METHOD OF OPERATING AUTOMATIC GAIN CONTROL IN THE PRESENCE OF HIGH PEAK-TO-AVERAGE RATIO BLOCKERS

BACKGROUND OF THE INVENTION

FIELD OF THE INVENTION

The present invention relates in general to wireless communications, and more particularly to controlling operation of automatic gain control in the presence of high peak-to-average ratio blockers.

DESCRIPTION OF THE RELATED ART

The Internet of Things (IoT) is a network of physical devices or other items embedded with electronics, software, sensors, actuators, etc., which enables the devices to interface each other and to exchange information. A home automation system, for example, may be used to control devices and functions in a home or the like, such as lighting, HVAC (climate control), entertainment systems, appliances, home security devices (including access control and alarm systems and the like), etc. It is understood, of course, that IoT encompasses much more than home automation and residential applications and may be used for various commercial applications. IoT may be implemented using any one of many different wireless technologies, such as ZigBee, Thread, Z-wave, etc.

Wi-Fi is one of the most common wireless standards that is virtually everywhere, including areas in common with IoT networks and the like. The wireless technologies used for IoT may operate in the same frequency band as most Wi-Fi installations, such as, for example, the 2.4 Gigahertz (GHz) frequency band. It is desired that all such wireless networks operate successfully when located in the same area. One particular problem occurs when an IoT wireless system is attempting to receive a desired weak signal in the presence of a far away (10-50 MHz) and relatively strong (~10 decibel-milliwatts or dBm) Wi-Fi signal, which at least partially blocks the desired weak signal. Although wireless systems have to work with blockers of all kinds, Wi-Fi signals that are modulated with orthogonal frequency-division multiplexing (OFDM) are particularly challenging since OFDM signals have high peak-to-average ratios.

Most automatic gain control (AGC) circuits are driven by peak detectors that attempt to adjust the gain of the front end of the wireless receiver to detect and capture the desired signal even in the presence of blocker signals. The front end of the IoT wireless receiver, for example, may include a radio frequency (RF) peak detector responsive to transmitted wireless signals in the wireless medium, and an intermediate frequency (IF) peak detector responsive to signal strength of the desired signal contained within the RF signal. Thus, a conventional AGC, in response to indications of the RF peak detector, may attempt to reduce the gain at higher OFDM levels and may also attempt to increase the gain again at lower OFDM levels, whereas the IF peak detector may indicate to the AGC to do just the opposite particularly if the desired signal is relatively weak. The contention between the peak detectors may cause the AGC to chatter or "ping-pong" resulting in loss of the signal or at least reduction of performance.

In addition, the peak detectors are configured to either detect the real peak of a signal or that determine a root-mean-square (RMS) power level of the signal. An AGC driven by a real peak detector may set the gain lower than necessary so that occasional peaks in the OFDM signal trigger a gain reduction and therefore prevent the wireless system from receiving the desired weak signal. If, on the other hand, the AGC is driven by RMS detection, then the AGC may set the gain higher than necessary causing the front end of the wireless system to saturate when receiving the peaks of the OFDM signal. In either case, performance is impacted negatively.

SUMMARY OF THE INVENTION

A wireless receiver according to one embodiment includes a gain network, a level detector, a timing system, a gain up disable circuit, a blocker strength detect circuit, and an automatic gain control (AGC) circuit. The gain network is capable of adjusting a gain of a received wireless signal and providing a corresponding radio frequency (RF) signal. The level detector provides a level indication while a strength of the RF signal is at least an RF level threshold. The timing system provides a timing value indicative of a total amount of time that the level indication is provided during a timing window. The gain up disable circuit provides a gain up disable signal when the timing value reaches a low threshold, and the blocker strength detect circuit provides a gain down request signal when the timing value reaches a high threshold. The AGC circuit does not increase the gain of the gain network while the gain up disable signal is provided, and may allow a reduction of the gain of the gain network while the gain down request signal is provided.

The level detector may be configured as a root-mean-square (RMS) detector that provides the level indication when the RMS level of the RF signal reaches the RF level threshold. The timing system may be configured to terminate a current timing window and begin a next timing window either when a duration of the current timing window reaches a predetermined time amount or when the timing value reaches the high threshold. The timing system may reset the timing value and the gain down request signal for the next timing window.

The timing system may include a window circuit and a counter. The window circuit determines a maximum duration of the timing window by counting cycles of a clock signal and incrementing a window count value up to a maximum count value. The counter determines the timing value by counting the cycles of the clock signal and incrementing a peak count value only while the level indication is provided during the timing window. The window circuit may terminate a current timing window and begin a next timing window when either the window count value reaches the maximum count value or when the peak count value reaches the high threshold. The peak count value, the window count value and the gain down request may be reset for the next timing window.

The window circuit may further include a gear circuit that provides a gear value based on a gear setting, in which case the window circuit determines the maximum count value as a default window count value when the gain up disable signal is not provided, and determines the maximum count value as the default window count value modified by the gear value when the gain up disable signal is provided.

The gain down request signal may be reset when the AGC circuit reduces the gain of the gain network. The low threshold may be indicative of a weak blocker signal and the high threshold may be indicative of a strong blocker signal. The low and high thresholds may be determined to identify a relative strength of high peak-to-average ratio blockers.

The wireless receiver may further include a conversion circuit that converts the RF signal into an intermediate frequency (IF) signal, and a second level detector that provides a second level indication when a strength of the IF signal is at least an IF level threshold. The AGC circuit may increase the gain of the gain network when the second level indication and the gain up disable signal are not provided.

A method of operating automatic gain control of a wireless receiver according to one embodiment includes receiving a radio frequency (RF) signal provided through a gain network, providing a level indication while a strength of the RF signal is at least an RF level threshold, providing a timing value indicative of a total amount of time that the level indication is provided during a timing window, preventing an increase of gain of the gain network when the timing value reaches a low threshold, and requesting a reduction of the gain of the gain network when the timing value reaches a high threshold in which the high threshold is greater than the low threshold.

The method may include providing the level indication while a root-mean-square (RMS) level of the RF signal exceeds the RF level threshold. The method may terminating a current timing window and beginning a next timing window either when a duration of the current timing window reaches a predetermined time amount or when the timing value reaches the high threshold, and resetting the timing value and the gain down request signal for the next timing window.

The method may include determining a maximum duration of the timing window by counting cycles of a clock signal and incrementing a window count value up to a maximum count value, and determining the timing value by counting the cycles of the clock signal and incrementing a peak count value only while the level indication is provided during the timing window. The method may include terminating a current timing window and beginning a next timing window when either the window count value reaches the maximum count value or when the peak count value reaches the high threshold, and resetting the peak count value, the window count value and the gain down request for the next timing window. The method may include providing a gear value based on a gear setting, determining the maximum count value as a default window count value when the gain up disable signal is not provided, and determining the maximum count value as the default window count value modified by the gear value when the gain up disable signal is provided.

The method may include resetting the gain down request signal after reducing the gain of the gain network. The method may include determining the low threshold to indicate a weak blocker signal and determining the high threshold to indicate a strong blocker signal. The method may include determining the low and high thresholds to identify a relative strength of high peak-to-average ratio blockers.

The method may further include converting the RF signal into an IF signal, providing a second level indication when a strength of the IF signal is at least an IF level threshold, and increasing the gain of the gain network when the second level indication signal and when the gain up disable signal are not provided.

BRIEF DESCRIPTION OF THE DRAWINGS

The present invention is illustrated by way of example and is not limited by the accompanying figures in which like references indicate similar elements. Elements in the figures are illustrated for simplicity and clarity and have not necessarily been drawn to scale.

DETAILED DESCRIPTION

The inventors have recognized the deficiency of conventional operation of automatic gain control (AGC) when attempting to receive a desired signal in the presence of a blocker signal having a high peak-to-average ratio. They have therefore developed an AGC interface circuit that gathers statistical information from the RF level detector at the front end of the wireless receiver and that uses the information to make decisions regarding adjusting the gain of the passive gain network. A timing system provides a timing value indicative of a duration of time that the level indication is provided during a timing window. If the timing value reaches a low threshold, then a gain up disable circuit provides a gain up disable signal that prevents the AGC circuit from increasing the gain of the passive gain network during the timing window. If the timing value reaches a high threshold, then a blocker strength circuit provides a gain down request signal to the AGC circuit to request that the gain of the passive gain network be reduced. In this manner, the AGC interface circuit more accurately evaluates the strength of the blocker signal to enable the AGC circuit to make improved gain decisions.

Figure 1:
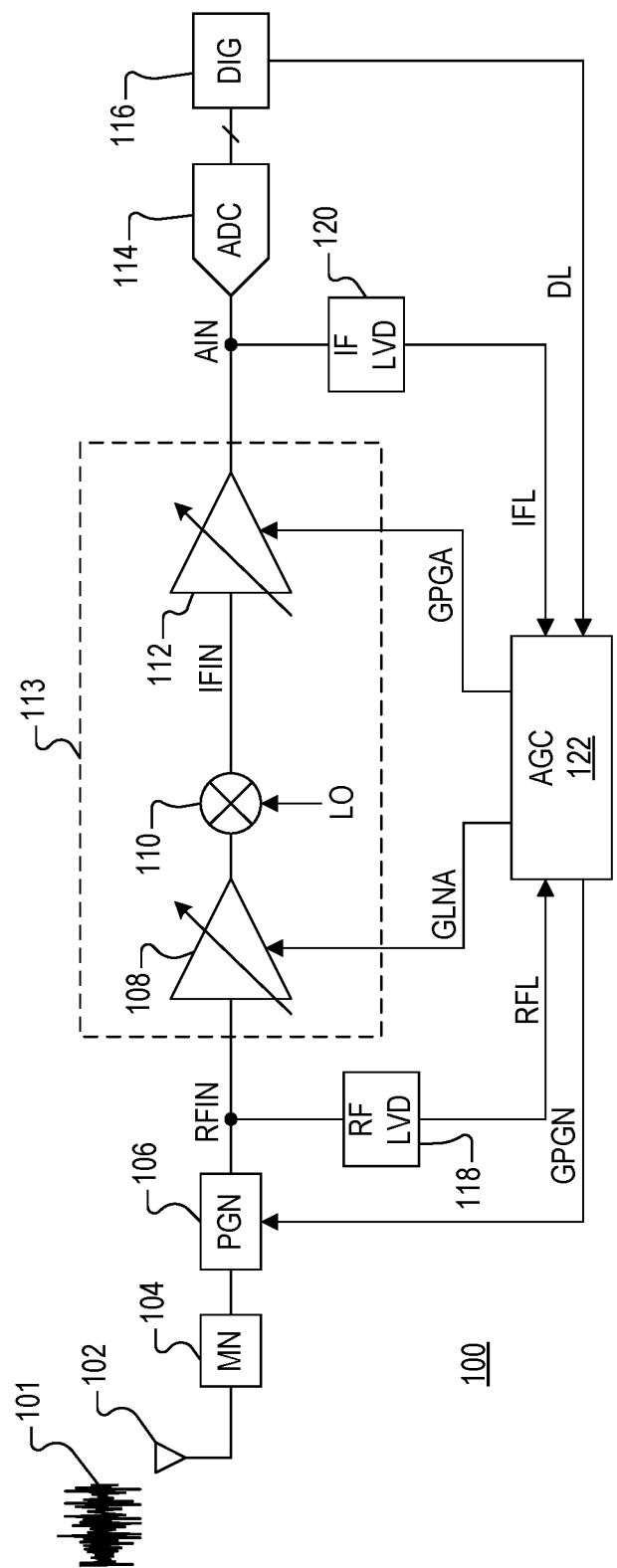
FIG. 1 is a simplified block diagram of a wireless receiver including automatic gain control implemented according to one embodiment of the present invention.

FIG. 1 is a simplified block diagram of a wireless receiver 100 including an AGC configuration implemented according to one embodiment of the present invention. An antenna 102 coupled to a matching network (MN) 104 provides a received wireless signal to an input of a passive gain network (PGN) 106. The matching network 104 enables tuning of the antenna 102 to reduce reflected energy and noise. The PGN 106 has an output providing a received radio frequency (RF) input signal (RFIN) to an input of a low-noise amplifier (LNA) 108. The LNA 108 has an output coupled to one input of a mixer 110, which has another input receiving a local oscillator (LO) signal and which has an output providing an intermediate frequency (IF) input signal IFIN to an input of a programmable gain amplifier (PGA) 112. The PGA 112 has an output providing an analog input (AIN) signal to an input of an analog-to-digital converter (ADC) 114, which has an output providing a digital signal to an input of a digital (DIG) circuit 116. The LNA 108, the mixer 110, and the PGA 112 collectively form a conversion circuit 113 that converts the RFIN signal to the AIN signal having an intermediate frequency.

The front end of the wireless receiver 100 is simplified in that only a portion of the overall receive signal chain is shown. For example, RF receiver configurations typically include both an in-phase portion and a quadrature phase portion although only one phase is depicted to represent either or both. Also, the front end may include additional components that are not shown, such as, for example, transimpedance amplifiers, low-pass filters, etc. The DIG circuit 116 generally represents the digital portion of the wireless receiver 100 for extracting the transmitted signal and includes various digital processing circuits (not shown), such as, for example, a digital or channel filter or the like, a received signal strength indication (RSSI) circuit or the like, a microcontroller or processor or the like, etc.

An RF level detector (LVD) 118 detects the strength of the RFIN signal and develops an RF level (RFL) signal indicative of the relative strength of the RF signal being received. The RFL signal may simply be a digital or binary signal indicating that the strength or magnitude of the RFIN signal exceeds an RF level threshold. An IF level detector 120 detects the strength of the AIN signal and develops an IF level (IFL) signal indicative of the relative strength of the IF signal being received. The IFL signal may simply be a digital or binary signal indicating that the strength or magnitude of the AIN signal exceeds an IF level threshold. Each of the level detectors 118 and 120 may be configured as either a peak detector or a root-mean-square (RMS) detector. Although the RF level detector 118 is often referred to as a "peak" detector, in practice it is often configured as an RMS detector to detect the RMS level of RFIN. The IF level detector 120 may also be configured as an RMS detector, but in practice is usually configured as a peak detector for detecting the peak level of AIN. Nonetheless, it is understood that each of the level detectors 118 and 120 may be configured according to either detector type.

It is noted that when the RF level detector 118 is configured as an RMS detector, it may be configured as a wide band detector having a wide enough bandwidth to detect RF signal peak arrival. A narrow band RMS detector, for example, may miss RF peaks if those peaks are sufficiently separated. Although a narrow band RMS detector can detect signal peaks if they arrive sufficiently close to each other in a given duration, the narrow band RMS detector may fail if RF peaks arrive spaced apart in the given duration.

The RFL and IFL signals are provided to respective inputs of an automatic gain control (AGC) circuit 122. Although not further described, the DIG circuit 116 may include the RSSI circuit or the like for determining the relative strength of the incorporated digital signal and may provide a digital level (DL) value of the AGC circuit 122. The AGC circuit 122 uses the level values, among other information, to control the gain of various blocks of the front end of the wireless receiver 100 in an attempt to successfully detect and acquire any desired wireless signals. As shown, the AGC circuit 122 provides a passive gain (GPGN) signal to control the gain of the PGN 106, provides an LNA gain (GLNA) signal to control the gain of the LNA 108, and provides a PGA gain (GPGA) signal to control the gain of the PGA 112.

The wireless receiver 100 may be configured according to any one of several different wireless standards, architectures, or protocols, such as ZigBee, Thread, Z-wave, low-energy BlueTooth (BLE), etc., for operating in networks that provide a low data transfer rate, energy efficiency and secure networking. These protocols, which are based on IEEE 802.15.4, operate in the 2.4 Gigahertz (GHz) industrial, scientific, and medical radio (ISM) band, and support 16 non-overlapping 2 Megahertz (MHz) bandwidth channels at 5 MHz spacing with transmit powers up to +20 decibel-milliwatts (dBm).

Although not shown, the wireless receiver 100 may be operating in the same area or in close proximity with Wi-Fi devices (not shown) implemented according to any one of the various IEEE 802.11 standards, such as 802.11a, 802.11b, 802.11g, 802.11n, etc. IEEE 802.11n, for example, may operate using 20 MHz bandwidth channels and 52 orthogonal frequency-division multiplexing (OFDM) subcarrier modulation. Wi-Fi (IEEE 802.11b/g/n) supports up to 14 overlapping 20/22 MHz bandwidth channels across the 2.4 GHz ISM band with transmit power levels up to +30 dBm.

It is desired to improve the operation of the wireless receiver 100 in the presence of a Wi-Fi network transmitting Wi-Fi signals. As shown in FIG. 1, for example, a transmitted OFDM Wi-Fi signal 101 is particularly challenging since it has a relatively high peak-to-average ratio. When the wireless receiver 100 is attempting to receive a desired weak signal while the OFDM Wi-Fi signal 101 is also being transmitted, the OFDM Wi-Fi signal 101 at least partially blocks the desired weak signal and presents a challenge for the AGC 122 to set the gains at the appropriate levels.

In one scenario, for example, the OFDM Wi-Fi signal 101 may be relatively far away in terms of frequency, such as, for example, from 10 MHz to 50 MHz away, but relatively strong, such as, for example, about 10 dB). The AGC 122 may set the gain of the PGN 106 at a suitable level while the OFDM Wi-Fi signal 101 is at a moderate signal level. The IF level detector 120 cooperates with the AGC 122 to adjust the gain levels of the LNA 108 and the PGA 112 to keep a peak of the AIN signal between lower and upper thresholds of the ADC 114. If the desired signal being received is relatively weak, then the LNA 108 and the PGA 112 may be set at high or even maximum gain levels.

In a conventional configuration, the RF level detector 118 may trigger and assert the RFL signal in an attempt to reduce the gain of the PGN 106 upon onset of a subsequent peak of the OFDM Wi-Fi signal 101. If the AGC 122 reduces the gain of the PGN 106 to avoid saturation of the LNA 108, the strength of the AIN signal is consequently reduced. If the AIN signal is too weak, then the IF level detector 120 may respond by requesting a gain increase, but if the LNA 108 and the PGA 112 are already at high or even maximum gain levels, then a conflict arises between the level detectors attempting to control the gain of the PGN 106. The AGC 122 may increase the gain of the PGN 106, but such increase may either saturate the LNA 108 with corresponding loss of signal information or may be too slow causing a loss of the desired signal. Also, intermittent peaks of the OFDM Wi-Fi signal 101 may cause chatter or oscillation of the AGC 122 when configured according to the conventional configuration. As further described herein, the AGC 122 is configured to avoid this undesirable scenario and to improve performance.

Figure 2:
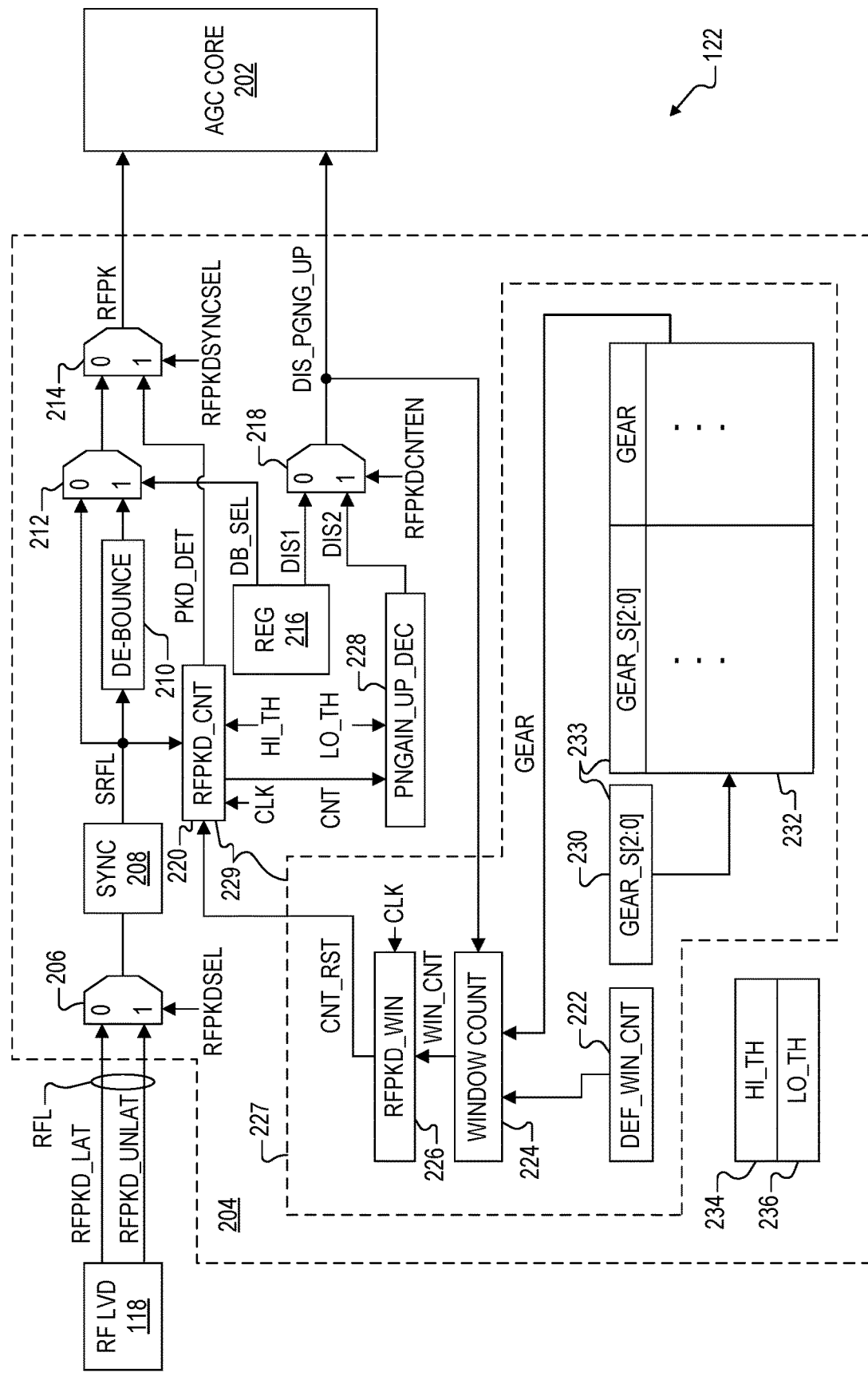
FIG. 2 is a more detailed block diagram of the automatic gain control circuit of FIG. 1 implemented according to one embodiment of the present invention interfaced to the RF level detector of FIG. 1.

FIG. 2 is a more detailed block diagram of the AGC 122 implemented according to one embodiment of the present invention interfaced to the RF level detector 118. In the illustrated embodiment, the AGC 122 includes an RF interface 204 and an AGC core 202, in which the RF interface 204 receives the RFL signal from the RF level detector 118 and develops corresponding control signals to the AGC core 202 as further described herein. As shown, the RFL signal may include two separate signals, including a latched version RFPKD_LAT and an unlatched version RFPKD_UN-LAT. Both of these RFL signals are provided to respective inputs of a 2-input multiplexer (MUX) 206, having a control input receiving a select signal RFPKDSEL. The output of the MUX 206 provides a selected RFL signal to an input of a synchronization (SYNC) circuit 208. The SYNC circuit 208 synchronizes the selected RFL signal to a local clock signal CLK of the AGC 122. The SYNC circuit 208 outputs a locally synchronized signal SRFL, which is provided to an input of a debounce circuit 210 and to one input of another 2-input MUX 212. The output of the debounce circuit 210 is provided to the other input of the MUX 212, having its output provided to a first input of another 2-input MUX 214. The MUX 214 receives a select signal RFPKDSYNCSEL at its control input and its output provides an RF peak signal RFPK to an input of the AGC core 202. A register circuit 216 provides a signal DB_SEL to the control input of the MUX 212 and provides a first disable signal DIS1 to a first input of another 2-input MUX 218. The MUX 218 receives a select signal RFPKDCNTEN at its control input and its output provides a "PGN gain up" disable signal DIS_PGNG_UP to another input of the AGC core 202.

In one possible mode of operation, the RFPKDSEL, the RFPKDSYNCSEL, and the RFPKDCNTEN control signals are all asserted to logic "0" so that the MUX 206 provides the latched RFPKD_LAT signal to the input of the SYNC circuit 208, the MUX 214 provides the output of the MUX 212 as the RFPK signal to the AGC core 202, and the MUX 218 provides the DIS1 signal as the DIS_PGNG_UP signal to the AGC core 202. In this configuration, when the latched RFPKD_LAT signal is asserted in response to the RFIN signal exceeding the RF level threshold, the SYNC circuit 208 asserts the SRFL signal. Whether the SRFL signal is debounced or not (determined by the DB_SEL signal), it is passed directly to the AGC core 202 (via the MUXes 212 and 214) which responds by lowering the gain of the PGN 106. The RF level detector 118 may be subsequently reset during reception. It is possible in this situation for the wireless receiver 100 to successfully acquire the desired signal as long as it is not too weak.

If the DIS1 signal is negated low or is otherwise not asserted, then the AGC core 202 may respond to an indication by the IF level detector 120 potentially resulting in contention between the peak detectors. If the DIS1 signal is asserted high, then the DIS_PGNG_UP signal is also asserted so that the AGC core 202 avoids a subsequent increase of the gain of the PGN 106. This may avoid the contention between the level detectors 118 and 120. The assertion of DIS1, however, may lead to another undesirable condition. If the RFPKD_LAT signal is asserted in response to a peak of a Wi-Fi signal causing the AGC core 202 to decrease the gain of the PGN 106 when a desired signal is not being transmitted, and if the DIS_PGNG_UP signal is also asserted, then the AGC 122 may not be reset before onset of a weak desired signal while the gain of the PGN 106 is still low. In this case, the weak desired signal may not be detected at all. The remaining portion of the RF interface 204 is provided to avoid this undesired scenario and to improve overall performance.

An RF peak counter (RFPKD_CNT) circuit 220 provides a peak detect signal PKD_DET to the other input of the MUX 214. The RFPKD_CNT circuit 220 has inputs receiving the SRFL signal, the clock signal CLK, a count reset signal CNT_RST, and a high threshold value HI_TH. The high threshold value HI_TH may be a programmable value, such as being stored in a storage element 234. Each storage element described herein may be implemented in any suitable manner, such as a read-only memory (ROM), a random-access memory (RAM), a register, etc. Another storage element 222 stores a default window count value DEF_WIN_CNT, which is provided to an input of a window count circuit 224. The window count circuit 224 provides a window count value WIN_CNT to an input of an RF peak window (RFPKD_WIN) circuit 226, having another input receiving CLK and having an output providing the CNT_RST signal to the RFPKD_CNT circuit 220. The storage element 222, the window count circuit 224 and the RFPKD_WIN circuit 226 are part of a window circuit 227. The window circuit 227 and the RFPKD_CNT circuit 220 collectively form a timing system 229.

The RFPKD_CNT circuit 220 also provides a digital count value CNT to an input of a PNG gain up decision (PNGAIN_UP_DEC) circuit 228, which has another input receiving a low threshold value LO_TH and which has an output providing a second disable signal DIS2 to the second input of the MUX 218. A storage element 236 may be used to store LO_TH. The DIS_PGNG_UP signal at the output of the MUX 218 is provided to another input of the window count circuit 224. Another storage element 230 stores a selected gear value GEAR_S[2:0], which is provided to an input of a memory 232. The memory 232 may be implemented as a RAM or ROM or other memory type and may be configured as a lookup table receiving GEAR_S[2:0] and providing a corresponding GEAR value to another input of the window count circuit 224. In one embodiment, GEAR_S[2:0] is a 3-bit value for selection one of up to 8 different values of GEAR, although any other suitable number of GEAR values may be implemented. The storage element 230 and the memory 232 collectively form a gear circuit 233 that provides the GEAR value based on a gear setting selected by GEAR_S[2:0]. The gear circuit 233 is shown as part of the window circuit 227.

Figure 6:
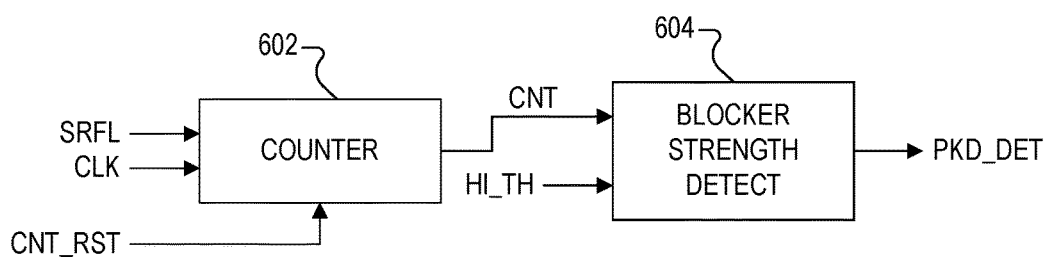
FIG. 6 is a more detailed block diagram of the RF peak counter (RFPKD_CNT) circuit of FIG. 2 according to one embodiment of the present invention.

The select values RFPKDSEL, RFPKDSYNCSEL and RFPKDCNTEN are each asserted high or logic "1" to operate the RF interface 204 of the AGC 122 according to another operating mode. The MUX 206 selects and provides the unlatched version RFPKD_UNLAT of the RFL signal to the SYNC circuit 208, which asserts SRFL whenever RFIN is above the RF level threshold of the RF level detector 118. FIG. 6 shows a more detailed block diagram of the RFPKD_CNT circuitry 220 including a counter 602 receiving the SRFL, CLK and CNT_RST signals and providing CNT. The counter 602 of the RFPKD_CNT circuit 220 increments CNT for each cycle of CLK in which SRFL is asserted during a timing window established by WIN_CNT from the window count circuit 224. In one embodiment, WIN_CNT corresponds to a number of CLK cycles establishing the duration of the timing window. When a timing window completes, the RFPKD_WIN circuit 226 asserts CNT_RST to reset the counter 602 of the RFPKD_CNT circuit 220 which resets CNT, and the RFPKD_WIN circuit 226 starts a new timing window as further described herein.

If CNT reaches the low threshold LO_TH during any timing window, then the PNGAIN_UP_DEC circuit 228 asserts DIS2 which is provided as the DIS_PGNG_UP signal to the AGC core 202. When the DIS_PGNG_UP signal is asserted, the AGC core 202 is prevented from increasing the gain of the PGN 106. The PNGAIN_UP_DEC circuit 228 serves as a gain up disable circuit providing DIS_PGNG_UP (via DIS2) as a gain up disable signal. If CNT also reaches the high threshold HI_TH during any timing window, the RFPKD_CNT circuit 220 asserts PKD_DET so that RFPK is also asserted as detected by the AGC core 202. The RFPK signal serves as a gain down request signal in which the AGC core 202 may reduce the gain of the PGN 106 when RFPK is asserted. In this manner, the RFPKD_CNT circuit 220 includes a blocker strength detect circuit 604 that requests a reduction of the gain of the PGN 106 when the blocker signal is strong. The blocker strength circuit 604 receives CNT and HI_TH and asserts RFPK (via PKD_DET) when CNT reaches HI_TH.

In one embodiment, WIN_CNT is determined to be the default value DEF_WIN_CNT while the DIS_PGNG_UP signal is not asserted (e.g., when DIS_PGNG_UP is a logic "0"). When the DIS_PGNG_UP signal is asserted, however, the window count circuit 224 multiplies the DEF_WIN_CNT value by the GEAR value to provide the WIN_CNT value. In one embodiment, the DEF_WIN_CNT is a digital or binary value and GEAR is based on a factor of 2, so that WIN_CNT is increased or decreased by a factor of 2. GEAR_S[2:0] may serve as an index to a lookup table to access any one of multiple gear values stored in the memory 232.

In summary of operation of the wireless receiver 100 when the RF interface 204 is configured into the second mode of operation, the output of the RF level detector 118 is observed for a period of time to generate statistical information regarding the power level of the RFIN signal for making an improved gain decision rather than responding to every peak of the wireless signal. If the RFIN signal is relatively weak such that CNT does not achieve the low threshold value LO_TH during the timing window, then RFPK is not asserted to the AGC core 202. Also, DIS_PGNG_UP is not asserted so that the AGC core 202 may increase or decrease the gain of the PGN 106 based on other information, such as the IFL level value from the IF level detector 120.

When the RFIN signal is somewhat stronger such that CNT does achieve the low threshold value LO_TH but does not achieve the high threshold value HI_LO during the timing window, then DIS_PGNG_UP is asserted while RFPK remains unasserted. In this case the AGC core 202 may decrease the gain of the PGN 106 but is prevented from increasing the gain of the PGN 106 even if the signal strength is reduced.

When the RFIN signal is strong such that CNT achieves the high threshold value HI_LO during the timing window, then DIS_PGNG_UP is asserted and RFPK is also asserted. The AGC core 202 may reduce the gain of the PGN 106 in response to RFPK being asserted indicating a strong blocker signal. Also, the gain of the PGN 106 is prevented from being increased when DIS_PGNG_UP is asserted. By adjusting the high threshold HI_TH, peaks of an OFDM signal may be filtered so that only strong OFDM signals may cause the AGC core 202 to reduce the gain of the PGN 106. By adjusting the low threshold LO_TH, a decision may be made regarding the relative strength of the OFDM signal for determining when to return to normal operation.

Figure 3:
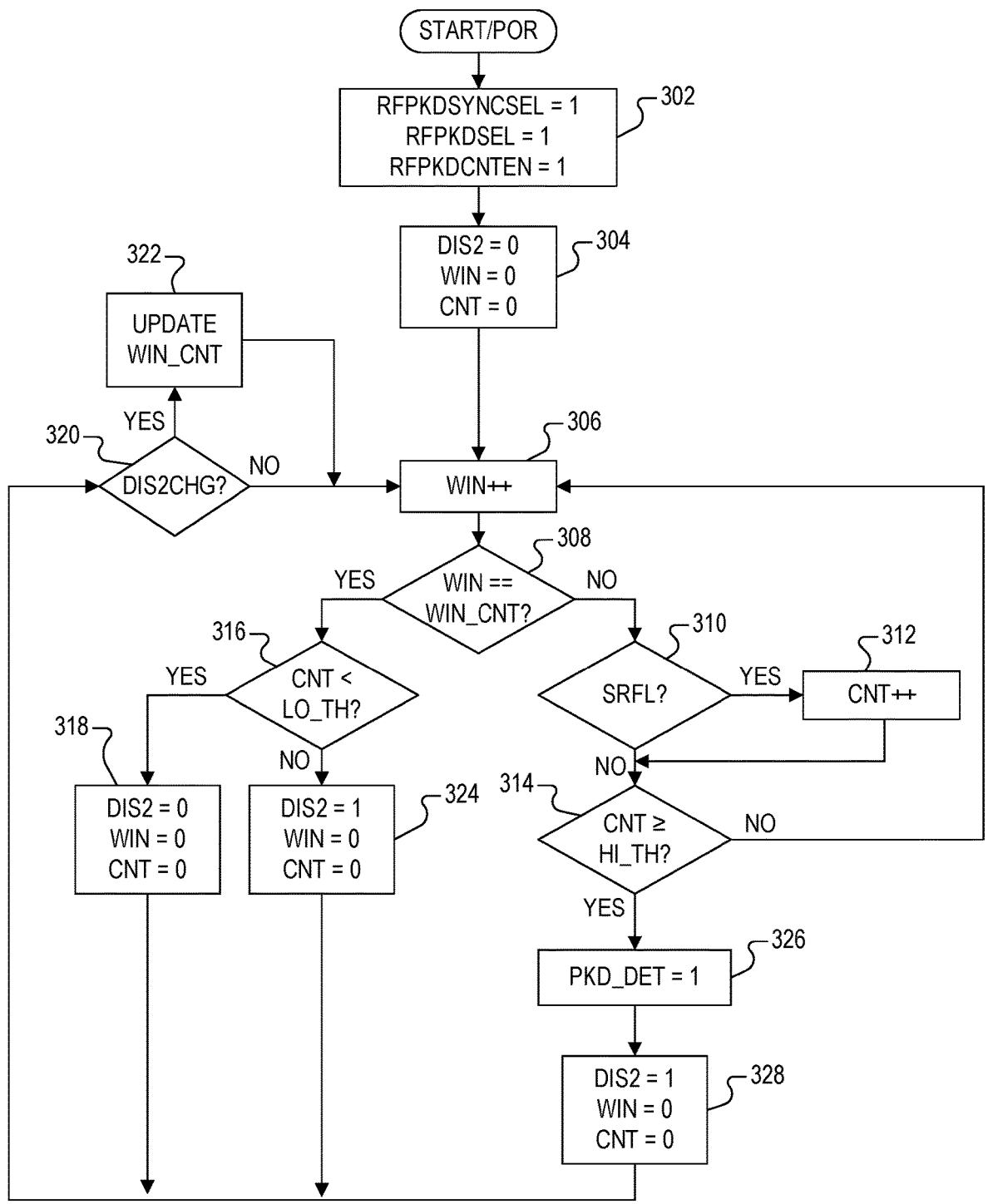
FIG. 3 is a flowchart diagram illustrating operation of the RF interface of FIG. 2 implemented according to one embodiment of the present invention.

FIG. 3 is a flowchart diagram illustrating operation of the RF interface 204 implemented according to one embodiment of the present invention. Upon power on or reset (POR) of the wireless receiver 100 including reset of the AGC 122, operation proceeds to a first block 302 in which the select signals RFPKDSYNCSEL, RFPKDSEL, and RFPKD-CNTEN are each asserted high or logic "1" to enable the peak statistical circuitry. These select signals are assumed to remain asserted high or to be reasserted high upon reset of the AGC 122 during operation. At next block 304, DIS2, a window count value WIN, and the count value CNT are each initialized to zero. The window count value WIN is incremented by the RFPKD_WIN circuit 226 for each cycle of the clock signal CLK to track elapsed time of the timing window up to a maximum duration defined by WIN_CNT.

As previously described, the RFPKD_CNT circuit 220 increments the count value CNT for each cycle of CLK in which SRFL is asserted.

WIN is incremented at next block 306 and then compared with WIN_CNT in the following block 308 by the RFPKD_WIN circuit 226. In the first iteration WIN is less than WIN_CNT so operation advances to block 310 in which the SRFL signal is evaluated. If SRFL is asserted, then operation advances to block 312 in which the count value CNT is incremented by the RFPKD_CNT circuit 220. If instead SRFL is not asserted at block 310, or after CNT is incremented at block 312, operation advances to block 314 in which it is queried whether CNT is greater than or equal to the high threshold value HI_TH. Assuming CNT has not yet reached HI_TH, operation loops back to block 306 to again increment WIN. Operation repeatedly loops between blocks 306 and 314 until WIN reaches WIN_CNT as determined at block 308, or until CNT reaches or exceeds HI_TH as determined at block 314. During this loop, WIN is incremented for each CLK cycle during the current timing window, during which time CNT is incremented only if SRFL is asserted.

If WIN reaches WIN_CNT at block 308 before CNT reaches HI_TH, then the current timing window is completed and operation proceeds instead to block 316 in which it is determined whether CNT is less than the low threshold LO_TH. If so, then operation proceeds to block 318 in which DIS2, WIN, and CNT are all reset back to zero. In this case, the RFIN signal is relatively weak so that CNT does not even reach the low threshold value LO_TH during the entire current timing window, so that RFPK is not asserted to the AGC core 202. Also, DIS_PGNG_UP is not asserted so that the AGC core 202 may increase or decrease the gain of the PGN 106 based on other information.

After block 318, operation advances to block 320 to query a value DIS2CHG indicating whether the DIS2 value was changed during the current timing window that just completed. If so, operation advances to block 322 in which the window count circuit 224 updates the WIN_CNT value for the next window. As previously described, WIN_CNT is initially set to be equal to the default window count value DEF_WIN_CNT, in which WIN_CNT may be modified (e.g., multiplied) by the GEAR value based on the state of DIS_PGNG_UP (which is based on the state of DIS2). If DIS2 has not changed as determined at block 320, or after WIN_CNT has been updated at block 322, operation loops back to block 306 in which WIN is incremented to start the next window. It is noted that the time duration of each window is determined by the count value WIN_CNT multiplied by the period of the clock signal CLK, in which WIN_CNT is equal to DEF WIN_CNT or DEF WIN_CNT modified by GEAR.

Referring back to block 316, if instead CNT has exceeded the low threshold LO_TH, then operation proceeds instead to block 324 in which DIS2 is set equal to logic value "1" which also causes DIS_PGNG_UP to be asserted to the AGC core 202. When asserted in this manner, the AGC core 202 is prevented from increasing the gain of the PGN 106. The WIN and CNT values are reset back to zero at block 324. In this intermediate case, the RFIN signal is somewhat stronger so that CNT exceeds the low threshold value LO_TH, but CNT does not reach the high threshold value HI_LO during the timing window. RFPK remains unasserted while DIS_PGNG_UP is asserted. In this case the AGC core 202 may decrease but is prevented from increasing the gain of the PGN 106. The gain of PGN 106 is not allowed to increase even if the signal strength is reduced. After block 324, operation loops back to block 320 previously described.

If CNT does reach the high threshold HI_TH during the current timing window as determined at block 314, operation instead proceeds to block 326 in which the RFPKD_CNT circuit 220 asserts PKD_DET high (e.g., logic "1"), which causes the RFPK signal to be asserted to the AGC core 202. Operation then advances to block 328 in which DIS2 is set to logic "1" to assert DIS_PGNG_UP to the AGC core 202, and WIN and CNT are both reset back to zero. DIS_PGNG_UP is asserted since because CNT reached HI_TH, it also exceeded LO_TH. In this case, the RFIN signal is strong so that CNT achieves the high threshold value HI_LO during the timing window, so that RFPK and DIS_PGNG_UP are both asserted to the AGC core 202. The AGC core 202 reduces the gain of the PGN 106 in response to a strong blocker signal and the gain of the PGN 106 is not allowed to increase. It is noted that when CNT reaches or exceeds HI_TH at any time during a timing window, the timing window is completed even if WIN has not reached WIN_CNT, and the next timing window is initiated. After block 328, operation loops back to block 320 previously described.

The RF interface 204 is reset back to block 302 whenever the wireless receiver 100 or the AGC 122 is reset. Reset of the AGC 122 occurs, for example, upon POR of the wireless device 100, whenever the wireless device 100 wakes up from a sleep mode during normal operation, or after reception of a desired signal to prepare for receiving a subsequent signal. The wireless device 100 may wake from sleep mode at scheduled intervals, at one or more scheduled times, upon detection of an asynchronous prompts (e.g., interrupts or the like), etc.

Figure 4:
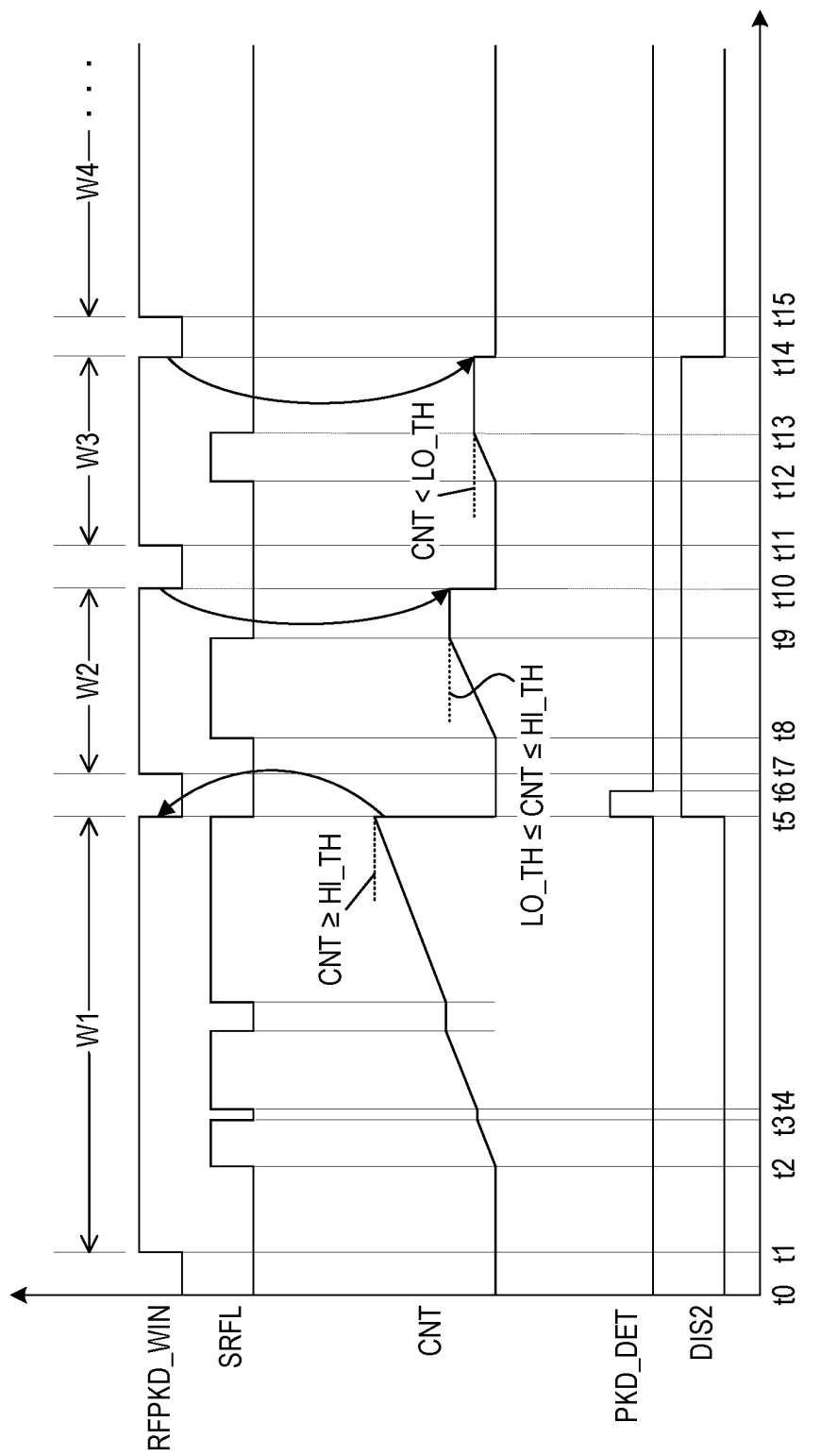
FIG. 4 is a timing diagram illustrating operation of the operation of the RF interface of FIG. 2 implemented according to one embodiment of the present invention.

FIG. 4 is a timing diagram illustrating operation of the operation of the RF interface 204 implemented according to one embodiment of the present invention when the select signals RFPKDSYNCSEL, RFPKDSEL, and RFPKDCNTEN are each asserted high or logic "1" to enable the peak statistical circuitry. The timing diagram plots a signal RFPKD_WIN indicating each timing window established by the RFPKD_WIN circuit 226, and also plots the signals or values SRFL, CNT, PKD_DET, and DIS2 versus time. At an initial time t0, each of the signals RFPKD_WIN, SRFL, CNT, PKD_DET, and DIS2 are shown reset at zero. At subsequent time t1, RFPKD_WIN is asserted high indicating the beginning of a first timing window W1. At a subsequent time t2, SRFL goes high indicating that the RF level detector 118 has detected that RFIN has increased above the RF level threshold. Beginning at time t2, CNT incrementally increases while SRFL remains high. At a subsequent time t3, SRFL goes back low and then goes back high again at next time t4, so that CNT remains flat between times t3 and t4 and incrementally increases after time t4. Operation continues in this manner during the current timing window W1 in which CNT is incrementally increased only while SRFL is high.

At a subsequent time t5 during the first timing window W1, CNT reaches (or exceeds) the high threshold HI_TH causing termination of the timing window W1 regardless of whether the window count WIN has reached WIN_CNT. At time t5, the RFPKD_CNT circuit 220 asserts PKD_DET high and the MUX 214 correspondingly asserts RFPK high. In response, the AGC core 202 may decrease the gain of the PGN 106 which results in SRFL going low since RFIN is reduced below the RF level threshold of the RF level detector 118. Also, CNT is reset back to zero at time t5 and the RFPKD_CNT circuit 220 resets PKD_DET back to zero at subsequent time t6. In addition, at time t5 the PNGAIN UP DEC circuit 228 asserts DIS2 high causing the MUX 218 to assert DIS_PGNG_UP high so that the AGC core 202 is prevented from increasing the gain of the PGN 106 while DIS_PGNG_UP is high.

At a subsequent time t7, RFPKD_WIN goes high indicating that the RFPKD_WIN circuit 220 has initiated a second timing window W2. Since the value of DIS2 changed, the window count circuit 224 updates the value of WIN_CNT by modifying (e.g., multiplying) DIS WIN_CNT by the GEAR value. In the illustrated configuration, GEAR is less than one so that WIN_CNT is reduced to reduce the duration of the second timing window W2. Also, DIS2, and thus DIS_PGNG_UP, remains asserted high during the timing window W2, so that the AGC core 202 is prevented from increasing the gain of the PGN 106 during the timing window W2. SRFL goes high between times t8 and t9 during the timing window W2, so that CNT is incrementally increased between times t8 and t9. CNT, however, does not reach the high threshold HI_TH during the timing window W2. At subsequent time t10, WIN reaches WIN_CNT and RFPKD_WIN goes low indicating that the RFPKD_WIN circuit 226 terminates the timing window W2. At this time it is determined that CNT has reached the low threshold LO_TH so that DIS2 (and thus DIS_PGNG_UP) remains asserted. Since CNT did not reach the high threshold HI_TH during the timing window W2, PKD_DET remains low.

At a subsequent time t11, RFPKD_WIN goes high indicating that the RFPKD_WIN circuit 226 has initiated a third timing window W3. Since the value of DIS2 has not changed, WIN_CNT remains at a reduced value similar to the second timing window W2. Since, DIS2 remains asserted high during the timing window W3, the AGC core 202 is prevented from increasing the gain of the PGN 106. SRFL goes high between times t12 and t13 during the timing window W3, so that CNT is incrementally increased between times t12 and t13. CNT, however, does not reach the high threshold HI_TH during the timing window W3. At subsequent time t14, WIN reaches WIN_CNT and RFPKD_WIN goes low indicating that the RFPKD_WIN circuit 226 terminates the timing window W3. At time t14, it is determined that CNT has not even reached the low threshold LO_TH so that DIS2 is pulled back low while PKD_DET remains low.

At a subsequent time t15, RFPKD_WIN goes high indicating that the RFPKD_WIN circuit 226 has initiated a fourth timing window W4. Since the value of DIS2 changed, the window count circuit 224 updates the value of WIN_CNT back to the original default level DEF_WIN_CNT. Operation continues in similar manner for the timing window W4 which is not further described, other than to note that in the illustrated configuration, window W4 has a default length that is longer than the timing windows W2 and W3. The length of the timing window W4 may be cut short if CNT reaches HI_TH before WIN reaches WIN_CNT as previously described.

Figure 5:
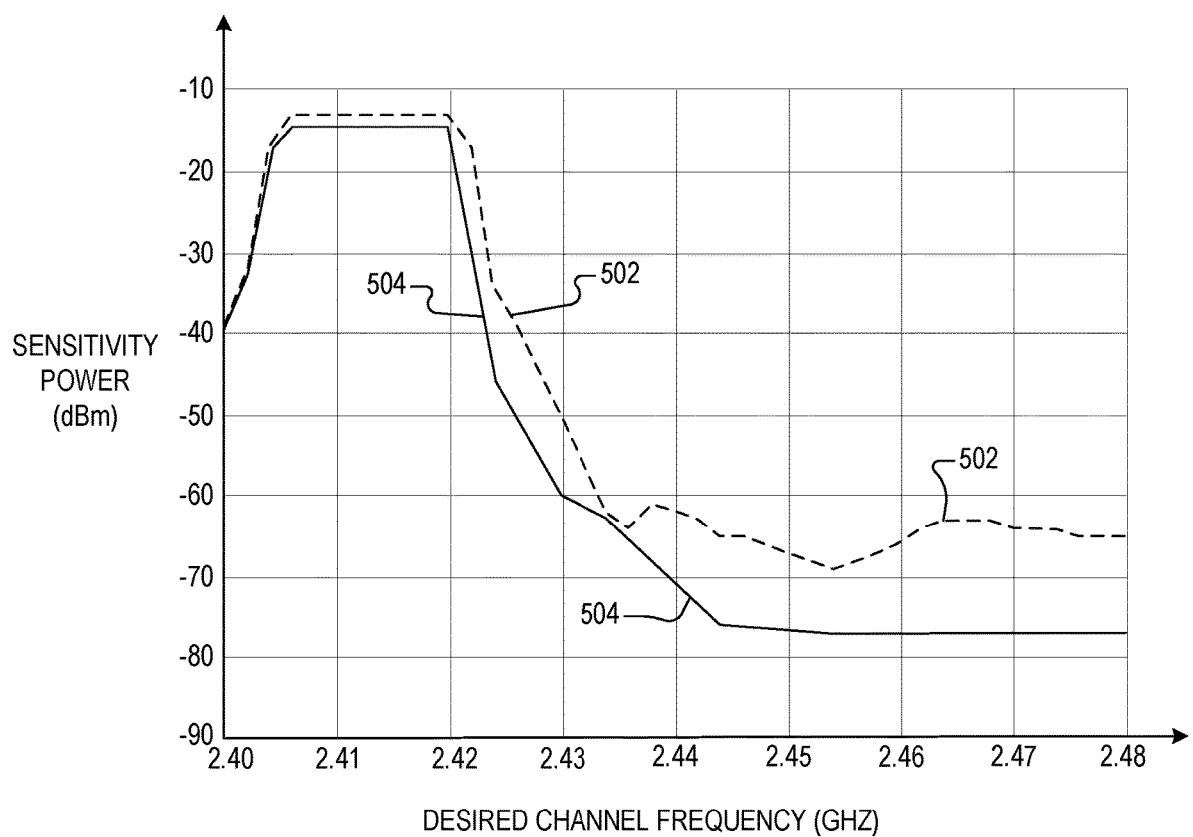
FIG. 5 is a graphic diagram plotting sensitivity power versus desired channel frequency in the presence of a Wi-Fi blocker comparing performance of the wireless receiver of FIG. 1 implemented according to one embodiment of the present invention versus a conventional configuration.

FIG. 5 is a graphic diagram plotting sensitivity power in dBm versus desired channel (CH) frequency in Hz in the presence of a Wi-Fi blocker centered at a frequency of 2.412 GHz comparing performance of the wireless receiver 100 (e.g., configured according to BLE) versus a conventional configuration. The sensitivity power indicates the power level that is needed for the transmitted signal in order to obtain a specified packet error rate (PER), such as about 31% for BLE or about 1% for Zigbee. The sensitivity power for the conventional configuration is plotted at 502 (using a dashed line) and the sensitivity power for the wireless receiver 100 is plotted at 504. Both configurations require a relatively high transmit power level in the channels from 2.40 to 2.48 GHz since these channels coincide with the WiFi blocker signal. The requisite transmit power level decreases at the higher frequency channels for both configurations, but remains about 10 dB lower for the wireless receiver 100 above about 2.44 GHz.

At a 50 MHz offset of about 2.462 GHz and higher, the sensitivity power level for the conventional configurational configuration increases between 5 dB to 7 dB representing a difference of about 15 dB as compared to the sensitivity power level for the wireless receiver 100 at the higher frequency channels. The wireless receiver 100, when operating automatic gain control in the presence of high peak-to-average ratio blockers as described herein, enables a substantial reduction of the requisite transmit power level over time.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A wireless receiver, comprising:
a gain network for adjusting a gain of a received wireless signal and that provides a corresponding radio frequency (RF) signal;
a level detector that provides a level indication while a strength of said RF signal is at least an RF level threshold;
a timing system that provides a timing value indicative of a total amount of time that said level indication is provided during a timing window;
a gain up disable circuit that provides a gain up disable signal when said timing value reaches a low threshold;
a blocker strength detect circuit that provides a gain down request signal when said timing value reaches a high threshold, wherein said high threshold is greater than said low threshold; and
an automatic gain control core that does not increase said gain of said gain network while said gain up disable signal is provided, and that allows a reduction of said gain of said gain network while said gain down request signal is provided.

2. The wireless receiver of claim 1, wherein said level detector determines a root-mean-square level of said RF signal and provides said level indication when said root-mean square level reaches said RF level threshold.

3. The wireless receiver of claim 1, wherein said timing system terminates a current timing window and begins a next timing window either when a duration of said current timing window reaches a predetermined time amount or when said timing value reaches said high threshold, and wherein said timing system resets said timing value and said gain down request signal for said next timing window.

4. The wireless receiver of claim 1, wherein said timing system comprises:
a window circuit that determines a maximum duration of said timing window by counting cycles of a clock signal and incrementing a window count value up to a maximum count value; and
a counter that determines said timing value by counting said cycles of said clock signal and incrementing a peak count value only while said level indication is provided during said timing window.

5. The wireless receiver of claim 4, wherein said window circuit terminates a current timing window and begins a next timing window when either said window count value reaches said maximum count value or when said peak count value reaches said high threshold, and wherein said peak count value, said window count value and said gain down request are reset for said next timing window.

6. The wireless receiver of claim 4, wherein said window circuit further comprises:
a gear circuit that provides a gear value based on a gear setting; and
wherein said window circuit determines said maximum count value as a default window count value when said gain up disable signal is not provided and determines said maximum count value as said default window count value modified by said gear value when said gain up disable signal is provided.

7. The wireless receiver of claim 1, wherein said gain down request signal is reset when said automatic gain control core reduces said gain of said gain network.

8. The wireless receiver of claim 1, wherein said low threshold is indicative of a weak blocker signal and wherein said high threshold is indicative of a strong blocker signal.

9. The wireless receiver of claim 1, wherein said low and high thresholds are determined to identify a relative strength of high peak-to-average ratio blockers.

10. The wireless receiver of claim 1, further comprising:
a conversion circuit that converts said RF signal into an intermediate frequency (IF) signal;
a second level detector that provides a second level indication when a strength of said intermediate frequency signal is at least an IF level threshold; and
wherein said automatic gain control core increases said gain of said gain network when said second level indication and said gain up disable signal are not provided.

11. A method of operating automatic gain control of a wireless receiver, comprising:
receiving a radio frequency (RF) signal provided through a gain network;
providing a level indication while a strength of the RF signal is at least an RF level threshold;
providing a timing value indicative of a total amount of time that the level indication is provided during a timing window;
preventing an increase of gain of the gain network when the timing value reaches a low threshold; and
requesting a reduction of the gain of the gain network when the timing value reaches a high threshold in which the high threshold is greater than the low threshold.

12. The method of claim 11, wherein said providing a level indication comprises providing the level indication while a root-mean-square level of the RF signal exceeds the RF level threshold.

13. The method of claim 11, further comprising:
terminating a current timing window and beginning a next timing window either when a duration of the current timing window reaches a predetermined time amount or when the timing value reaches the high threshold; and resetting the timing value and the gain down request signal for the next timing window.

14. The method of claim 11, further comprising:

determining a maximum duration of the timing window by counting cycles of a clock signal and incrementing a window count value up to a maximum count value; and determining the timing value by counting the cycles of the clock signal and incrementing a peak count value only while the level indication is provided during the timing window.

15. The method of claim 14, further comprising:

terminating a current timing window and beginning a next timing window when either the window count value reaches the maximum count value or when the peak count value reaches the high threshold; and resetting the peak count value, the window count value and the gain down request for the next timing window.

16. The method of claim 14, further comprising:

providing a gear value based on a gear setting;

determining the maximum count value as a default window count value when the gain up disable signal is not provided; and determining the maximum count value as the default window count value modified by the gear value when the gain up disable signal is provided.

17. The method of claim 11, further comprising resetting the gain down request signal after reducing the gain of the gain network.

18. The method of claim 11, further comprising:

determining the low threshold to indicate a weak blocker signal; and determining the high threshold to indicate a strong blocker signal.

19. The method of claim 11, further comprising determining the low and high thresholds to identify a relative strength of high peak-to-average ratio blockers.

20. The method of claim 11, further comprising:

converting the RF signal into an intermediate frequency (IF) signal;

providing a second level indication when a strength of the IF signal is at least an IF level threshold; and increasing the gain of the gain network when the second level indication signal and when the gain up disable signal are not provided.

* * * * *